(12) United States Patent
Choong et al.

(10) Patent No.: US 11,488,866 B2
(45) Date of Patent: Nov. 1, 2022

(54) PACKAGE SUBSTRATE DIVIDING METHOD

(71) Applicant: DISCO CORPORATION, Tokyo (JP)

(72) Inventors: Wai Kit Choong, Tokyo (JP); Eric Chong, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/690,773

(22) Filed: Nov. 21, 2019

(65) Prior Publication Data
US 2020/0176315 A1 Jun. 4, 2020

(30) Foreign Application Priority Data

Nov. 29, 2018 (JP) .............................. JP2018-223333

(51) Int. Cl.
*H01L 21/78* (2006.01)
*H01L 21/304* (2006.01)

(52) U.S. Cl.
CPC .......... *H01L 21/78* (2013.01); *H01L 21/3043* (2013.01)

(58) Field of Classification Search
CPC ............... H01L 21/78; H01L 21/67092; H01L 21/3043
See application file for complete search history.

(56) References Cited

U.S. PATENT DOCUMENTS

| | | | | |
|---|---|---|---|---|
| 6,389,680 B1* | 5/2002 | Matsuta | ................ | H01L 21/304 257/E21.237 |
| 7,892,949 B2* | 2/2011 | Abe | ...................... | H01L 21/268 438/462 |
| 2011/0034007 A1* | 2/2011 | Yodo | ....................... | H01L 21/78 438/463 |
| 2011/0212574 A1* | 9/2011 | Sekiya | .................. | H01L 21/561 438/113 |
| 2012/0244663 A1* | 9/2012 | Mori | ....................... | H01L 24/92 257/E21.599 |
| 2018/0308717 A1* | 10/2018 | Hanajima | ............... | B08B 3/022 |

FOREIGN PATENT DOCUMENTS

JP 2016181569 A 10/2016

\* cited by examiner

*Primary Examiner* — Dale E Page
*Assistant Examiner* — Quovaunda Jefferson
(74) *Attorney, Agent, or Firm* — Greer, Burns & Crain, Ltd.

(57) ABSTRACT

A method for dividing a package substrate into a plurality of device packages. The package substrate has a mount surface on the front side where a plurality of division lines are formed and a sealing layer formed on the back side, in which devices are sealed. The method includes a groove forming step of forming a groove along each division line on the mount surface of the package substrate so that the groove has a depth corresponding to a finished thickness of each device package, a burr removing step of removing burrs produced from electrodes in the groove forming step, and a grinding step of grinding the sealing layer of the package substrate so that a thickness of the package substrate is reduced to the finished thickness, after performing the burr removing step, thereby dividing the package substrate into the plural device packages.

12 Claims, 3 Drawing Sheets

PACKAGE SUBSTRATE DIVIDING METHOD

BACKGROUND OF THE INVENTION

Field of the Invention

The present invention relates to a method for dividing a package substrate into a plurality of device packages.

Description of the Related Art

In cutting a package substrate such as a quad flat non-leaded package (QFN) substrate and a chip size package (CSP) substrate or cutting a plate-shaped workpiece having metal (ductile material) on each division line, burrs are produced from the metal. The production of such burrs may cause a short circuit of wiring or there is a possibility that the burrs may fall in handling the package substrate in a subsequent step, causing defective mounting of the device chips on a printed wiring board or the like.

To solve these problems, there has been proposed a method including the steps of half cutting the front side of the package substrate to form a half-cut groove on the front side of the package substrate and next spraying high-pressure water to the front side of the package substrate along the half-cut groove, thereby removing the burrs (see Japanese Patent Laid-Open No. 2016-181569, for example).

SUMMARY OF THE INVENTION

In the above method, however, the package substrate is fully cut from the front side along the half-cut groove after removing the burrs. In this full-cutting step, the side surface of a cutting blade comes into contact with the side surface of each electrode exposed in the half-cutting step, causing a drag of the side surface of each electrode. As a result, burrs may be further produced.

As another method, the package substrate may be fully cut from the back side along the half-cut groove after removing the burrs. However, the back side of the package substrate is sealed with a sealing resin and no pattern is formed on the back side of the package substrate. Accordingly, it is difficult to set the cutting blade at completely the same position as that of the half-cut groove formed on the front side of the package substrate in fully cutting the package substrate from the back side. In the case that the position of the groove formed on the back side of the package substrate in the full-cutting step is not completely the same as the position of the half-cut groove formed on the front side of the package substrate, a step is produced on the side surface of each chip (device package) to be formed, so that an odd-form chip (device package) is obtained. Further, there is a case that the cutting blade may be worn to form a round shape at the front end (outer circumferential edge). In this case, there arises a problem even when the position of the groove formed on the back side of the package substrate is completely the same as the position of the half-cut groove formed on the front side of the package substrate. That is, unless the depth of the half-cut groove formed on the front side of the package substrate and the depth of the groove formed on the back side of the package substrate are sufficient, a projection corresponding to the round shape of the cutting blade may be left on the side surface of each chip, causing the formation of an odd-form chip.

It is therefore an object of the present invention to provide a package substrate dividing method which can reduce the possibility of short circuit, defective mounting, and production of odd-form chips in dividing a package substrate into a plurality of device packages.

In accordance with an aspect of the present invention, there is provided a package substrate dividing method for dividing a package substrate into a plurality of device packages, the package substrate including a base substrate having a front side as a mount surface and a back side as a sealed surface opposite to the mount surface, a plurality of crossing division lines being set on the front side of the base substrate to thereby define a plurality of separate regions where a plurality of devices are respectively formed, a sealing layer in which the devices are sealed, and a plurality of electrodes being formed in each of the division lines so as to extend across each of the division lines, the package substrate dividing method including: a groove forming step of forming a groove along each of the division lines on the mount surface of the package substrate so that the groove has a depth corresponding to a finished thickness of each of the device packages; a burr removing step of removing burrs produced from the electrodes in the groove forming step; and a grinding step of grinding the sealing layer of the package substrate so that a thickness of the package substrate is reduced to the finished thickness, after performing the burr removing step, thereby dividing the package substrate into the plurality of device packages.

Preferably, the burr removing step includes a step of spraying a liquid toward the mount surface of the package substrate, thereby removing the burrs.

The dividing method according to the present invention includes the steps of forming a groove on the mount surface of the package substrate (half cutting the package substrate) along each division line so that the groove has a depth corresponding to the finished thickness, next removing the burrs produced in the groove forming step, and next grinding the sealing layer of the package substrate to thereby divide the package substrate into the plural device packages. Accordingly, the possibility of short circuit, defective mounting, and production of odd-form device packages can be reduced.

In the case that a liquid is sprayed toward the mount surface of the package substrate in the burr removing step, thereby removing the burrs, the burrs can be removed efficiently without adversely affecting the package substrate.

The above and other objects, features, and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE
PREFERRED EMBODIMENT

Figure 1A:
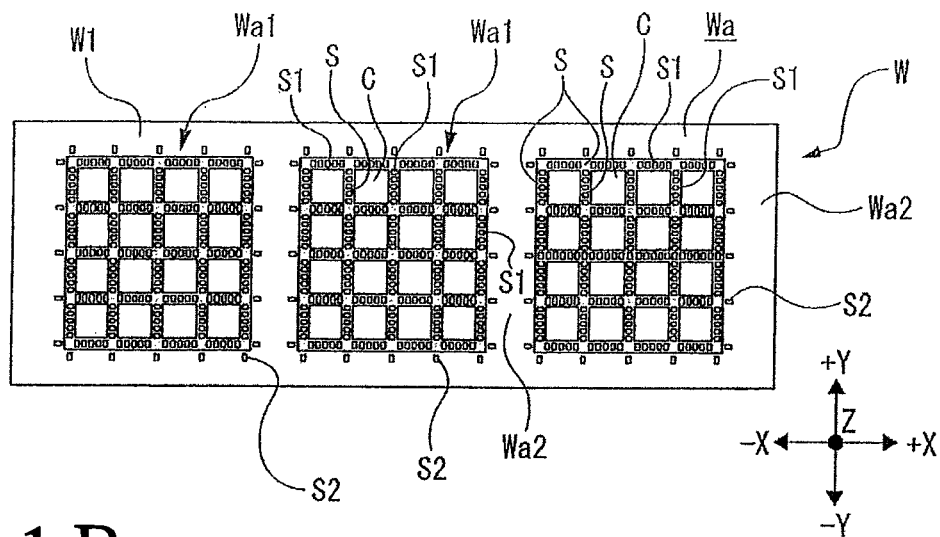
FIG. 1A is a top plan view depicting a package substrate.
Figure 1B:
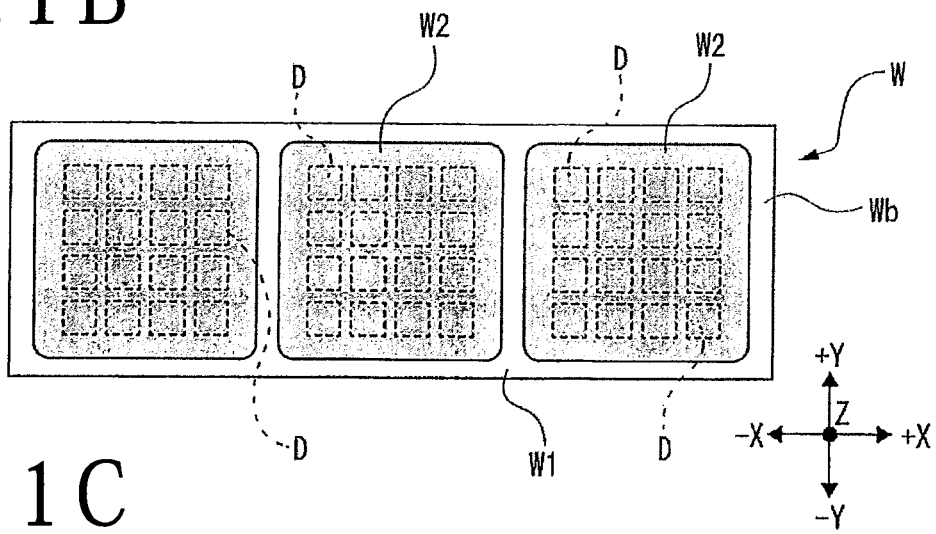
FIG. 1B is a bottom plan view of the package substrate depicted in FIG. 1A.
Figure 1C:
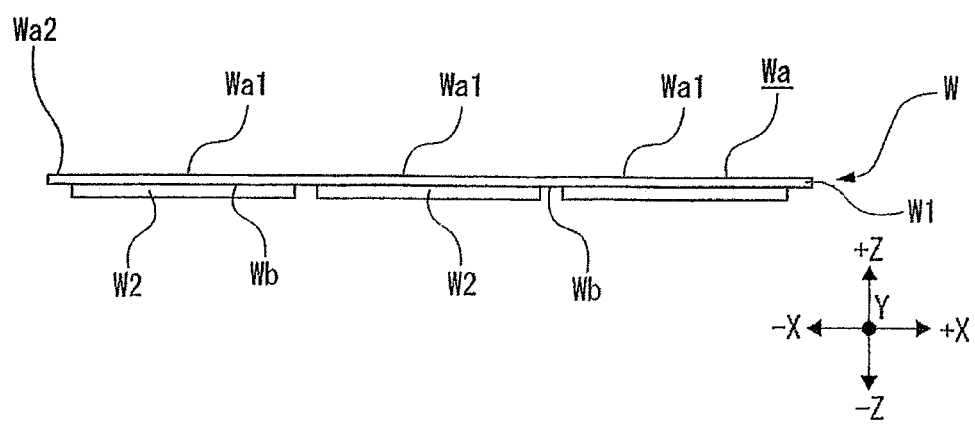
FIG. 1C is a side view of the package substrate depicted in FIG. 1A.

FIGS. 1A to 1C depict a package substrate W. For example, the package substrate W is a QFN substrate. The package substrate W has a base substrate W1 having a rectangular outside shape. The base substrate W1 is formed of metal such as 42 alloy (alloy of iron and nickel) and copper.

As depicted in FIG. 1A, the base substrate W1 has a front side as a mount surface Wa. A plurality of (e.g., three as depicted) device areas Wa1 are formed on the mount surface Wa. In each device area Wa1, a plurality of crossing division lines S are formed on the mount surface Wa to divide the device area Wa1 into individual device packages C respectively including devices D. That is, each device area Wa1 is divided along the division lines S by the method of the present invention. The crossing division lines S are composed of a plurality of parallel division lines S extending in a first direction and a plurality of parallel division lines S extending in a second direction perpendicular to the first direction. The base substrate W1 has a back side as a sealed surface Wb opposite to the mount surface Wa. The device D in each device package C is formed on the sealed surface Wb of the base substrate W1. For example, each device D is an integrated circuit (IC) or a light emitting diode (LED). Each device area Wa1 is surrounded by a peripheral marginal area Wa2, which is to be fragmented and discarded. Each device area Wa1 is partitioned by the plural crossing division lines S, and a plurality of electrodes S1 connected to each device D are formed in each division line S. Each electrode S1 extends across each division line S. A plurality of markers S2 for indicating the positions of the crossing division lines S are formed on the mount surface Wa in the peripheral marginal area Wa2 of the base substrate W1.

The plural electrodes S1 are insulated from each other by a molded resin on the base substrate W1. As depicted in FIG. 1B, a sealing layer W2 of resin for sealing the devices D in each device area Wa1 is formed on the sealed surface Wb of the package substrate W. The package substrate W is to be cut along each division line S in such a manner that each electrode S1 is cut at its center, so that the package substrate W is to be divided into the plural device packages C each including the sealing layer W2 in which each device D is sealed and the plural electrodes S1 cut as mentioned above.

There will now be described a preferred embodiment of the package substrate dividing method according to the present invention, in which the package substrate W depicted in FIGS. 1A to 1C is to be divided into the plural device packages C. The package substrate dividing method according to this preferred embodiment includes the following steps.

(1) Groove Forming Step

Figure 2:
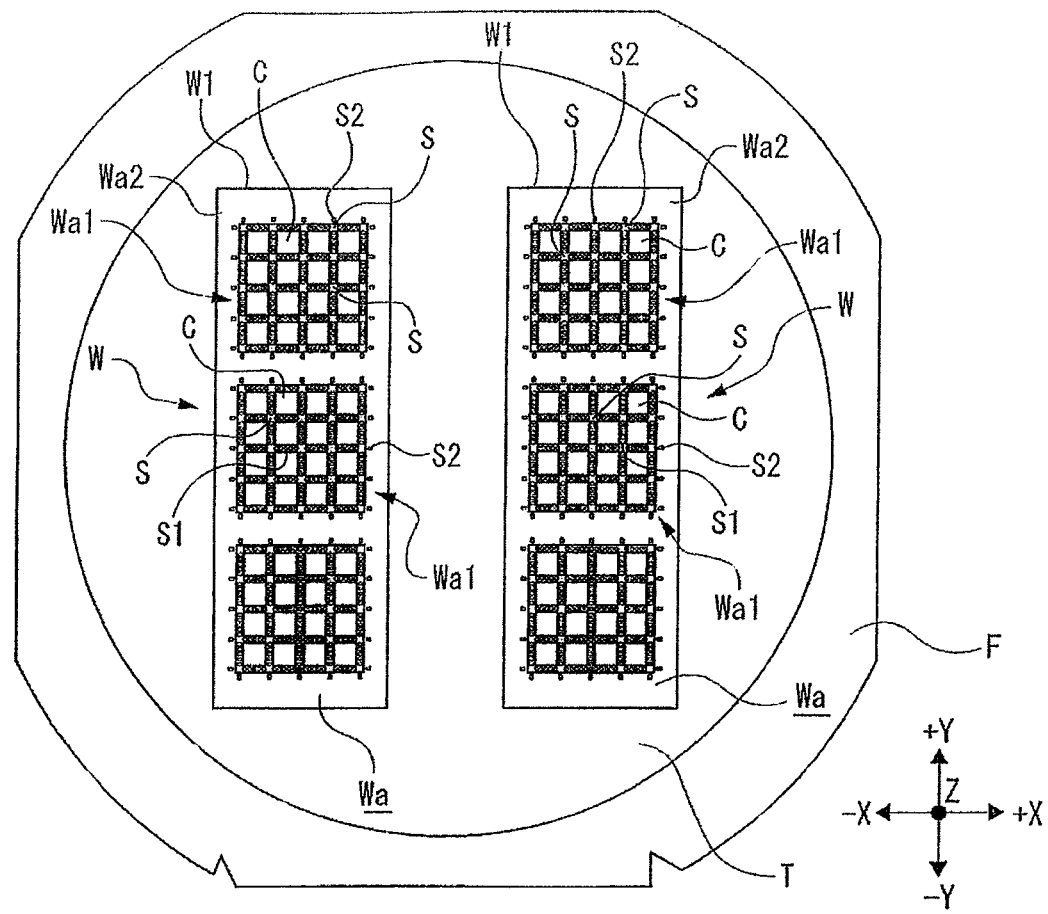
FIG. 2 is a top plan view depicting two package substrates supported through a dicing tape to a ring frame, each package substrate being the same as that depicted in FIG. 1A.

First, a groove is formed on the mount surface Wa along each division line S so that the groove has a depth corresponding to a finished thickness of each device package C. More specifically, a circular dicing tape T having an adhesive layer depicted in FIG. 2 is attached to the sealing surface Wb of the package substrate W depicted in FIG. 1B, that is, to the back side of the package substrate W. In this preferred embodiment, two package substrates W are attached to the adhesive layer of the dicing tape T as depicted in FIG. 2. However, three or more package substrates W may be attached to the dicing tape T or one package substrate W may be attached to the dicing tape T. As a modification, a dicing tape having the same shape and the same size as those of the package substrate W may be attached to the sealing surface Wb.

As depicted in FIG. 2, a ring frame F having an inside opening Fa is attached to a peripheral portion of the dicing tape T in the condition where the two package substrates W are attached to a central portion of the dicing tape T exposed to the inside opening Fa of the ring frame F. In attaching the two package substrates W and the ring frame F to the dicing tape T, the ring frame F is first placed on an attaching table (not depicted) and the two package substrates W are also placed on the attaching table in the condition where the sealing surface Wb of each package substrate W is oriented upward. At this time, the ring frame F is positioned with respect to the two package substrates W so that the two package substrates W are spaced a predetermined distance from each other and arranged substantially symmetrically with respect to the center of the inside opening Fa of the ring frame F. Thereafter, a press roller or the like is used to attach the dicing tape T to the two package substrates W placed on the attaching table in such a manner that the adhesive layer of the dicing tape T is pressed on the sealed surface Wb of each package substrate W, i.e., on the upper surface of each sealing layer W2 of each package substrate W placed on the attaching table (i.e., on the lower surface of each sealing layer W2 as viewed in FIG. 1C). At the same time, the adhesive layer of the dicing tape T is also attached at its peripheral portion to the ring frame F placed on the attaching table. As a result, the two package substrates W are supported through the dicing tape T to the ring frame F, so that the two package substrates W can be handled through the ring frame F. As a modification, an elongated sheet drawn from a tape roll may be first attached to the ring frame F and the two package substrates W, and next circularly cut along the inner circumference of the ring frame F by using a cutter.

Figure 3:
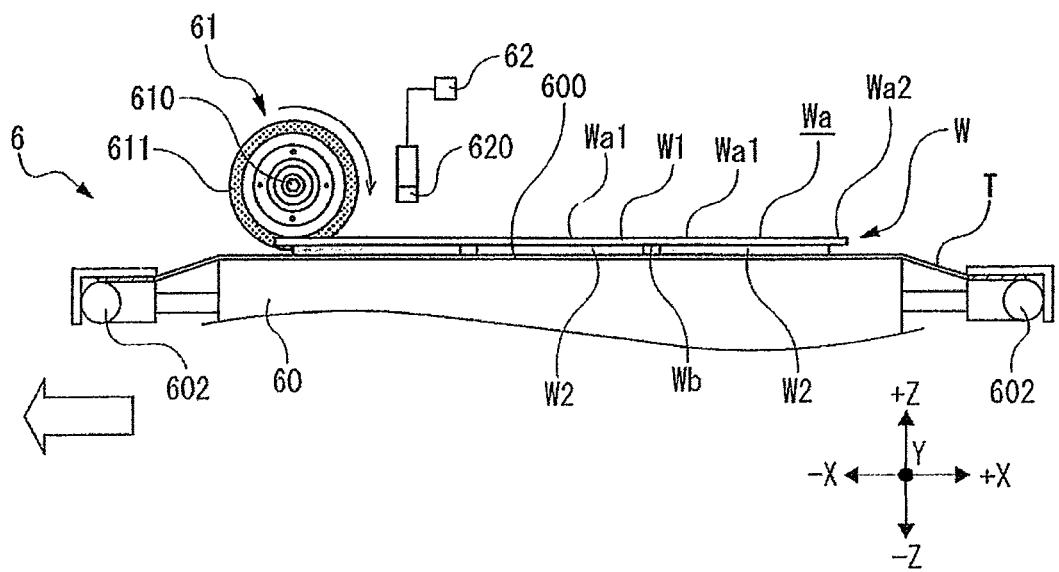
FIG. 3 is a side view depicting a groove forming step of forming a groove on the mount surface of each package substrate along each division line so that the groove has a depth corresponding to a finished thickness of each device package to be obtained by dividing each package substrate.

The reason for attaching the dicing tape T to each package substrate W is to hold each package substrate W on a chuck table 60 in a cutting apparatus 6 depicted in FIG. 3 under suction without causing a vacuum leak. In the case that the cutting apparatus 6 includes a so-called jig chuck capable of directly holding each package substrate W under suction, the dicing tape T may not be attached to each package substrate W. In this case, the jig chuck is fixed to a jig base. The jig chuck includes a plurality of cutting blade receiving grooves formed so as to correspond to the crossing division lines S of each package substrate W and a plurality of suction holes for respectively holding the individual device packages C obtained by cutting each package substrate W, the suction holes being connected to a vacuum source.

The two package substrates W supported through the dicing tape T to the ring frame F are transferred to the cutting apparatus 6 depicted in FIG. 3, for example. The cutting apparatus 6 essentially includes the chuck table 60 for holding each package substrate W under suction and cutting means 61 cutting each package substrate W held on the chuck table 60.

As depicted in FIG. 3, the cutting means 61 includes a spindle 610 having a rotation axis extending in the Y direction perpendicular to the sheet plane of FIG. 3. An annular cutting blade 611 is fixed to a front end portion of the spindle 610. The cutting means 61 is movable (indexable) in the Y direction. Further, the cutting means 61 is also movable (feedable) in the Z direction depicted by arrows +Z and −Z in FIG. 3.

The chuck table 60 has a circular outside shape. The chuck table 60 has a flat holding surface 600 for holding each package substrate W under suction. The holding surface 600 is formed of a porous material, for example. A vacuum source (not depicted) such as a vacuum generating apparatus is connected to the holding surface 600. Accordingly, a suction force produced by the vacuum source is transmitted to the holding surface 600 on which each package substrate W is placed, so that each package substrate W can be held on the holding surface 600 of the chuck table 60 under suction. The chuck table 60 is movable (feedable) in the X direction depicted by arrows +X and −X in FIG. 3. The chuck table 60 has a rotation axis extending in the Z direction. Further, a plurality of clamps 602 are provided around the chuck table 60 at equal intervals in the circumferential direction thereof, so as to hold the ring frame F.

Alignment means 62 is provided in the vicinity of the cutting means 61, so as to detect the division lines S of each package substrate W held on the chuck table 60. The alignment means 62 includes a camera 620 for imaging the division lines S to obtain an image. According to this image, the alignment means 62 performs image processing such as pattern matching to thereby detect the coordinate positions of the division lines S. The alignment means 62 and the cutting means 61 are integrated and they are adapted to be moved together both in the Y direction and in the Z direction.

The two package substrates W supported through the dicing tape T to the ring frame F are placed on the holding surface 600 of the chuck table 60 in the condition where the mount surface Wa of each package substrate W is oriented upward. Thereafter, the vacuum source is operated to produce a suction force, which is transmitted to the holding surface 600, so that each package substrate W is held under suction through the dicing tape T on the holding surface 600 of the chuck table 60. Further, the clamps 602 are operated to hold the ring frame F.

After holding each package substrate W on the chuck table 60, the chuck table 60 is moved in the −X direction and the alignment means 62 is operated to detect the coordinate position of a predetermined one of the division lines S extending in the first direction along which the cutting blade 611 is to be cut, in each package substrate W. In association with this detection of the coordinate position of the predetermined division line S, the cutting means 61 is moved in the Y direction to adjust the Y position of the cutting blade 611 to the Y position of the predetermined division line S in one of the two package packages W.

Thereafter, the cutting means 61 is lowered to a predetermined vertical position where the package substrate W is half cut by the cutting blade 611, i.e., where the lower end of the cutting blade 611 reaches a predetermined depth in the sealing layer W2. Further, the spindle 610 is rotated at a high speed by a motor (not depicted) to thereby rotate the cutting blade 611 fixed to the spindle 610 at a high speed. Thereafter, the chuck table 60 is further moved in the −X direction at a predetermined feed speed to thereby make the cutting blade 611 cut the mount surface Wa of the package substrate W. Accordingly, the electrodes S1, the base substrate W1, and sealing layer W2 are cut along the predetermined division line S by the cutting blade 611, thereby forming a groove M having a depth corresponding to a finished thickness L1 of each device package C (see FIG. 4). During cutting of the package substrate W, a cutting water is supplied from a nozzle (not depicted) to a position where the cutting blade 611 comes into contact with the package substrate W, thereby cooling this contact position and cleaning cutting dust off the package substrate W.

When the package substrate W is moved in the −X direction to a predetermined X position where the cutting along the predetermined division line S by the cutting blade 611 is finished, the feeding of the package substrate W in the −X direction is once stopped, and the cutting blade 611 is lifted away from the package substrate W. Thereafter, the chuck table 60 is moved in the +X direction to the original position. Thereafter, the cutting blade 611 is indexed in the Y direction by the pitch of the division lines S extending in the first direction, and the cutting operation is similarly performed along the next division line S. Thereafter, such an indexing operation and a cutting operation are similarly repeated to cut the package substrate W along all the division lines S extending in the first direction. Thereafter, the chuck table 60 is rotated 90 degrees to similarly repeat the cutting operation and the indexing operation, thereby cutting the package substrate W along all the other division lines S extending in the second direction perpendicular to the first direction. Thus, the package substrate W is cut along all the crossing division lines S to form a plurality of grooves M along all the crossing division lines S, in which each groove M has a depth corresponding to the finished thickness L1 of each device package C (see FIG. 4).

Thereafter, the other package substrate W is also similarly cut along all the crossing division lines S to form a plurality of similar grooves M along all the crossing division lines S.

(2) Burr Removing Step

Figure 4:
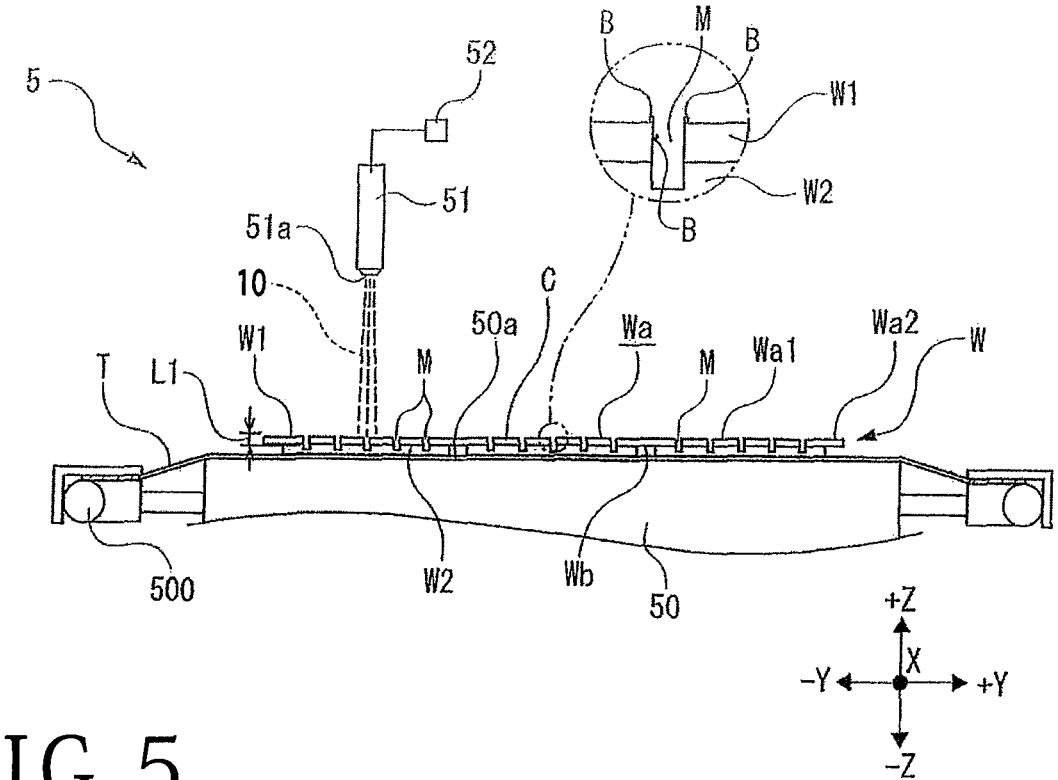
FIG. 4 is a side view depicting a burr removing step of spraying a liquid to the mount surface of each package substrate to thereby remove burrs produced from electrodes in the groove forming step.

After performing the groove forming step, the two package substrates W supported through the dicing tape T to the ring frame F are transferred to a burr removing apparatus 5 including a holding table 50 depicted in FIG. 4, in which the grooves M have already been formed on the front side of each package substrates W. The holding table 50 has a circular holding surface 50a for holding each package substrate W under suction. The two package substrates W supported through the dicing tape T to the ring frame F are placed on the holding surface 50a of the holding table 50 in the condition where the base substrate W1 of each package substrate W is oriented upward as depicted in FIG. 4. In this condition, a vacuum source (not depicted) is operated to hold each package substrate W through the dicing tape T on the holding surface 50a of the holding table 50 under suction. Alternatively, each package substrate W may not be held on the holding surface 50a under suction. That is, the vacuum source may not be operated. For example, a plurality of clamps 500 for fixing the ring frame F are provided around the holding table 50 at equal intervals in the circumferential direction thereof. Accordingly, the ring frame F supporting the two package substrates W through the dicing tape T is fixed by the plural clamps 500 as depicted in FIG. 4.

A high-pressure water nozzle 51 for spraying high-pressure water is provided above the holding table 50. The high-pressure water nozzle 51 and the holding table 50 are relatively movable both in the Y direction and in the X direction. The high-pressure water nozzle 51 is connected to a high-pressure water source 52 for supplying high-pressure water to the high-pressure water nozzle 51. A nozzle hole 51a is formed at the lower end of the high-pressure water nozzle 51 so as to be directed toward the holding surface 50a of the holding table 50.

As depicted in FIG. 4, burrs B are produced from the electrodes S1 and formed on the edges and side walls of each groove M in the groove forming step. These burrs B are removed in the burr removing step. In performing the burr removing step, the position of each groove M as a reference in spraying high-pressure water to the burrs B is detected by alignment means (not depicted). The alignment means functions to image the grooves M formed on each package substrate W and then perform image processing such as pattern matching according to the image obtained, thereby detecting the coordinate position of each groove M on each package substrate W.

In association with this detection of the grooves M, the high-pressure water nozzle 51 and the holding table 50 are relatively moved in the Y direction to align the high-pressure water nozzle 51 with a predetermined one of the grooves M of one of the two package substrates W. That is, the high-pressure water nozzle 51 is positioned directly above the predetermined groove M. Thereafter, the holding table 50 holding the package substrate W is moved at a predetermined feed speed in the −X direction (toward the back side of the sheet plane of FIG. 4) as a forward direction. At the same time, high-pressure water 10 is supplied from the high-pressure water source 52 to the high-pressure water nozzle 51. The high-pressure water 10 supplied is sprayed from the nozzle hole 51a of the high-pressure water nozzle 51 toward the predetermined groove M opening to the mount surface Wa of the package substrate W. The high-pressure water 10 sprayed to the mount surface Wa forms a circular spot having a diameter slightly larger than the width of each groove M, for example. Accordingly, the high-pressure water 10 sprayed collides with the burrs B formed on the edges and side walls of the predetermined groove M, thereby removing the burrs B.

When the holding table 50 is moved in the −X direction to a predetermined position where the spraying of the high-pressure water 10 along the predetermined groove M is finished, the holding table 50 is moved in the +Y direction by a predetermined index amount corresponding to the pitch of the grooves M, thereby aligning the high-pressure water nozzle 51 with the next groove M adjacent to the above predetermined groove M in the +Y direction. That is, the high-pressure water nozzle 51 is positioned directly above this next groove M. Thereafter, the holding table 50 is moved in the +X direction (toward the front side of the sheet plane of FIG. 4) as a backward direction as spraying the high-pressure water 10 from the high-pressure water nozzle 51. Accordingly, the high-pressure water 10 sprayed collides with the burrs B formed on the edges and side walls of this next groove M, thereby removing the burrs B. As a modification, the high-pressure water 10 may be sprayed toward two or more of the grooves M extending in the X direction at the same time.

After similarly spraying the high-pressure water along all the grooves M extending in the X direction, the holding table 50 is rotated 90 degrees to similarly spray the high-pressure water along all the other grooves M. Thus, the spraying of the high-pressure water to one of the two package substrates W is finished. Thereafter, the spraying of the high-pressure water to the other package substrate W is similarly performed to remove the burrs B.

The method of spraying the high-pressure water is not limited to the above method. For example, the high-pressure water may be sprayed along a line intersecting each groove M at approximately 45 degrees or approximately 60 degrees, for example, in a horizontal plane. As another modification, the detection of the position of each groove M by the alignment means may not be performed, in which the high-pressure water may be sprayed as rotating the high-pressure water nozzle 51 about a pivotal axis back and forth in a predetermined angular range.

(3) Grinding Step

Figure 5:
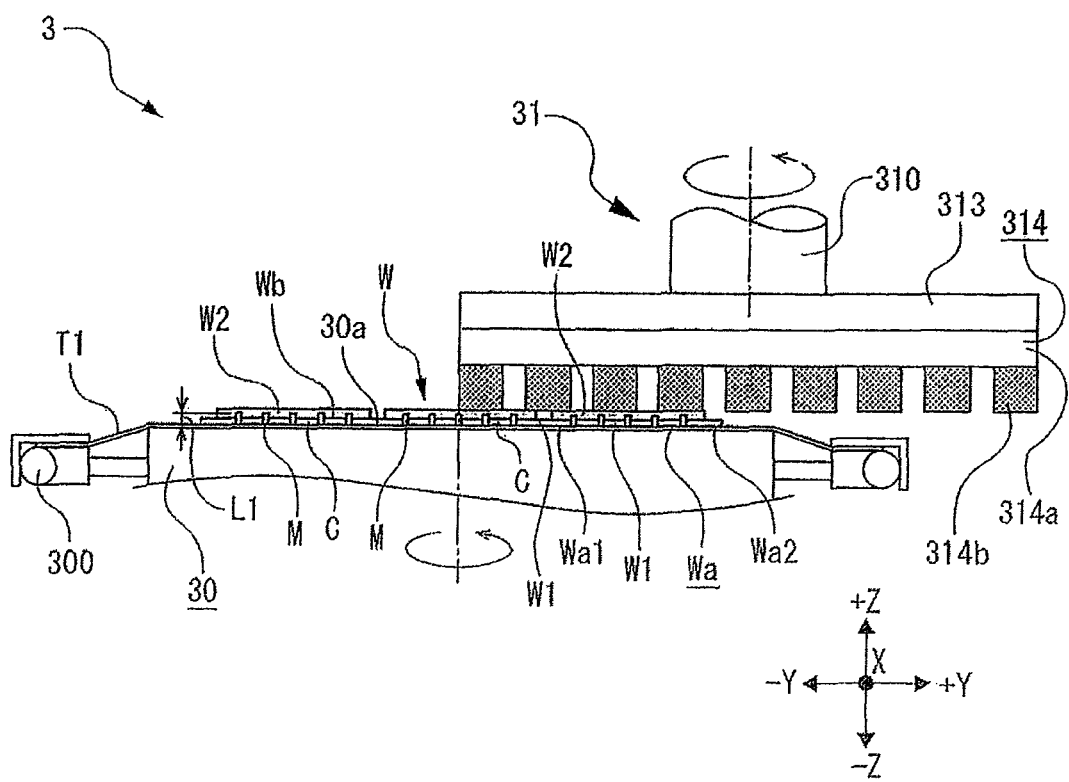
FIG. 5 is a side view depicting a grinding step of grinding the sealing layer of each package substrate to thereby reduce the thickness of each package substrate to the finished thickness, thereby dividing each package substrate into a plurality of device packages.

After performing the burr removing step, the dicing tape T is peeled from the sealing layers W2 of the two package substrates W and also peeled from the ring frame F. Thereafter, a tape mounter (not depicted) is used to attach a protective tape T1 to the mount surface Wa of each package substrate W as depicted in FIG. 5 and also to the ring frame F. Accordingly, the two package substrates W are supported through the protective tape T1 to the ring frame F. In this condition, the two package substrates W are spaced a predetermined distance from each other and arranged substantially symmetrically with respect to the center of the inside opening Fa of the ring frame F. As a modification, the ring frame F may not be used, but a protective tape having the same shape and the same size as those of each package substrate W may be attached to the mount surface Wa. As another modification, one package substrate W may be supported through the protective tape T1 to the ring frame F.

The two package substrates W thus supported through the protective tape T1 to the ring frame F are transferred to a grinding apparatus 3 including a chuck table 30 depicted in FIG. 5. The chuck table 30 is rotatable about a vertical axis extending in the Z direction and also movable in the Y direction.

The chuck table 30 has a circular holding surface 30a for holding each package substrate W under suction. The holding surface 30a is connected to a vacuum source (not depicted) for producing a suction force. The two package substrates W supported through the protective tape T1 to the ring frame F are placed on the holding surface 30a of the chuck table 30 in the condition where the sealing layers W2 of each package substrate W are oriented upward as depicted in FIG. 5. In this condition, the vacuum source is operated to transmit the suction force to the holding surface 30a. Accordingly, each package substrate W is held through the protective tape T1 on the holding surface 30a of the chuck table 30 under suction. In this condition, the center of the holding surface 30a of the chuck table 30 substantially coincides with the center of the inside opening Fa of the ring frame F, for example.

A plurality of clamps 300 for fixing the ring frame F are provided around the chuck table 30 at equal intervals in the circumferential direction thereof. Accordingly, the ring frame F supporting the two package substrates W through the protective tape T1 is fixed by the plural clamps 300 as depicted in FIG. 5. Thereafter, the clamps 300 are lowered to a level lower than that of the holding surface 30a.

As depicted in FIG. 5, the grinding apparatus 3 includes grinding means 31 grinding each package substrate W. The grinding means 31 includes a spindle 310 having a rotation axis extending in the Z direction, a disk-shaped mount 313 connected to the lower end of the spindle 310, and a grinding wheel 314 detachably connected to the lower surface of the mount 313. The grinding wheel 314 includes a wheel base 314a and a plurality of abrasive members 314b fixed to the lower surface of the wheel base 314a so as to be arranged annularly at given interval along the outer circumference of the wheel base 314a. Each abrasive member 314b has an outside shape like a substantially rectangular prism.

The chuck table 30 holding the two package substrates W through the protective tape T1 is moved in the +Y direction to the position below the grinding means 31, and the grinding wheel 314 is positioned relative to the two package substrates W. In other words, the chuck table 30 is positioned so that the center of rotation of the abrasive members 314b (the grinding wheel 314) is horizontally deviated from the center of rotation of the chuck table 30 by a predetermined distance, so that the path of rotation of the abrasive members 314b passes through the center of rotation of the chuck table 30 as viewed in plan.

Thereafter, the spindle 310 is rotated counterclockwise as viewed in plan, i.e., as viewed in the −Z direction, thereby rotating the grinding wheel 314. Further, feeding means (not depicted) included in the grinding apparatus 3 is operated to lower the grinding means 31 in the −Z direction, thereby bringing the abrasive members 314b being rotated into contact with the sealing layers W2 of each package substrate W. Accordingly, the sealing layers W2 of each package substrate W are ground by the abrasive members 314b. In this grinding operation, the chuck table 30 is also rotated counterclockwise, for example, as viewed in plan, i.e., as viewed in the −Z direction, thereby rotating each package substrate W held on the holding surface 30a. Accordingly, the whole of the upper surface of each sealing layer W2 can be ground by the abrasive members 314b as viewed in FIG. 5. Further, a grinding water is supplied to a position where the abrasive members 314b come into contact with the sealing layers W2, thereby cooling this contact position and cleaning grinding dust off each package substrate W.

By lowering the grinding means 31 in the −Z direction, the grinding wheel 314 is fed by a predetermined amount at a predetermined feed speed until the thickness of each package substrate W is reduced to the finished thickness L1. As a result, the bottom of each groove M is exposed to the upper surface of each sealing layer W2 as viewed in FIG. 5, so that each package substrate W is divided into the plural device packages C. Thereafter, the grinding means 31 is raised in the +Z direction away from each package substrate W.

The dividing method according to this preferred embodiment includes the steps of forming the grooves M on the mount surface Wa of each package substrate W (half cutting each package substrate W) along the crossing division lines S so that each groove M has a depth corresponding to the finished thickness L1, next removing the burrs B produced in each groove M in the previous step, and next grinding the sealing layers W2 of each package substrate W to thereby divide each package substrate W into the individual device packages C. Accordingly, the possibility of short circuit, defective mounting, and production of odd-form device packages can be reduced.

In the burr removing step, a liquid (high-pressure water) is sprayed toward the mount surface Wa of each package substrate W, thereby removing the burrs B. Accordingly, the burrs B can be removed efficiently without adversely affecting each package substrate W.

The package substrate dividing method according to the present invention is not limited to the above preferred embodiment, but various modifications may be made within the scope of the present invention. Further, the configurations of the cutting apparatus 6, the burr removing apparatus 5, and the grinding apparatus 3 depicted in the attached drawings are merely illustrative and they may be suitably changed within the scope where the effect of the present invention can be exhibited.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A package substrate dividing method for dividing a package substrate into a plurality of device packages, the package substrate including a base substrate having a front side as a mount surface and a back side as a sealed surface opposite to the mount surface, a plurality of crossing division lines being set on the front side of the base substrate to thereby define a plurality of separate regions where a plurality of devices are respectively formed, a sealing layer in which the devices are sealed, and a plurality of electrodes that are adjacent to each other and formed in each of the division lines so as to extend across each of the division lines, the package substrate dividing method comprising:
   a groove forming step of forming a groove along each of the division lines on the mount surface of the package substrate so that the groove has a depth corresponding to a finished thickness of each of the device packages, wherein the electrodes arranged adjacent to each other and extending across each of the division lines are cut such that a portion of each of the electrodes that are cut are on opposing sides of the division lines;
   a burr removing step of removing burrs produced from the electrodes cut in the groove forming step; and
   a grinding step of grinding the sealing layer of the package substrate so that a thickness of the package substrate is reduced to the finished thickness, after performing the burr removing step, thereby dividing the package substrate into the plurality of device packages.

2. The package substrate dividing method according to claim 1, wherein the burr removing step includes a step of spraying a liquid toward the mount surface of the package substrate, thereby removing the burrs.

3. The package substrate dividing method according to claim 1, wherein the burr removing step includes a step of spraying a liquid in the grooves along each of the division lines, thereby removing the burrs.

4. The package substrate dividing method according to claim 3, wherein the step of spraying a liquid in the grooves along each of the division lines includes spraying the liquid along a line intersecting each of the grooves at 45 degrees.

5. The package substrate dividing method according to claim 3, wherein the step of spraying a liquid in the grooves along each of the division lines includes spraying the liquid along a line intersecting each of the grooves at 60 degrees.

6. The package substrate dividing method according to claim 3, wherein the step of spraying a liquid in the grooves includes spraying the liquid in a form of a circular spot having a diameter that is larger than a width of each of the grooves.

7. The package substrate dividing method according to claim 3, wherein the step of spraying a liquid in the grooves includes spraying the liquid along a line intersecting each groove at approximately 45 degrees relative to a vertical line transverse to a longitudinal axis of each groove.

8. The package substrate dividing method according to claim 3, wherein the step of spraying a liquid in the grooves includes spraying the liquid along a line intersecting each groove at approximately 60 degrees relative to a vertical line transverse to a longitudinal axis of each groove.

9. The package substrate dividing method according to claim 1, further comprising forming markers in a peripheral marginal area on the mount surface to indicate the positions of the division lines.

10. The package substrate dividing method according to claim 1, further comprising imaging the division lines using an alignment means to detect the positions of the division lines and aligning a cutting means with the division lines.

11. The package substrate dividing method according to claim 1, wherein the groove forming step includes forming the groove along each of the division lines so that each of the plurality of electrodes are cut at a center of the electrodes.

12. The package substrate dividing method according to claim 1, wherein the plurality of electrodes includes identical electrodes.

* * * * *